(12) United States Patent
Maguire et al.

(10) Patent No.: US 11,930,607 B2
(45) Date of Patent: Mar. 12, 2024

(54) TOOL-LESS, LIMITED ROTATION, TELESCOPING FASTENER

(71) Applicant: EMC IP HOLDING COMPANY LLC, Hopkinton, MA (US)

(72) Inventors: Amrita Sidhu Maguire, Cedar Park, TX (US); Ilhan C Gundogan, Lexington, MA (US); Keith C Johnson, Medway, MA (US); Jason J Duquette, Milford, MA (US)

(73) Assignee: Dell Products L.P., Hopkinton, MA (US)

( * ) Notice: Subject to any disclaimer, the term of this patent is extended or adjusted under 35 U.S.C. 154(b) by 536 days.

(21) Appl. No.: 17/161,146

(22) Filed: Jan. 28, 2021

(65) Prior Publication Data

US 2022/0240401 A1   Jul. 28, 2022

(51) Int. Cl.
*F16B 21/02* (2006.01)
*H05K 5/02* (2006.01)
*H05K 7/14* (2006.01)

(52) U.S. Cl.
CPC .......... *H05K 5/0221* (2013.01); *F16B 21/02* (2013.01); *H05K 5/0256* (2013.01); *H05K 7/1488* (2013.01); *Y10T 403/7005* (2015.01)

(58) Field of Classification Search
CPC . Y10T 403/7005; F16B 21/02; H05K 5/0221; H05K 5/0256; H05K 7/1489
See application file for complete search history.

(56) References Cited

U.S. PATENT DOCUMENTS

| | | | | |
|---|---|---|---|---|
| 6,404,646 B1* | 6/2002 | Tsai | ........................ | G06F 1/184 361/801 |
| 7,259,959 B2* | 8/2007 | Tu | ........................... | G06F 1/184 361/679.33 |
| 7,695,031 B2* | 4/2010 | Jackson, Jr. | .............. | E05C 5/00 292/65 |
| 7,755,886 B2* | 7/2010 | Peng | ..................... | A47F 5/0846 361/679.33 |
| 8,089,759 B2* | 1/2012 | Sun | ....................... | H05K 5/0221 361/679.33 |
| 8,724,330 B1* | 5/2014 | Dittus | .................. | H05K 7/1489 361/726 |
| 8,756,963 B2* | 6/2014 | Le | ............................. | E05C 1/14 292/DIG. 37 |
| 9,363,921 B1* | 6/2016 | Chen | .................... | H05K 7/1489 |

(Continued)

*Primary Examiner* — Michael P Ferguson
(74) *Attorney, Agent, or Firm* — Anderson Gorecki LLP (57) ABSTRACT

A field-replaceable unit is reversibly secured in place using two captive fasteners. Each fastener includes a telescoping knob that rotates 180 degrees in a first direction to engage a latch mechanism and rotates 180 degrees in the opposite direction to disengage the latch mechanism. The knob automatically extends when the latch mechanism is disengaged. The knob alternately extends and retracts in response to being successively pressed when the latch mechanism is engaged. The knob has two cutaways formed along outside edges to facilitate a two-finger grip for knob rotation and pulling the unit out of another module. A circular groove centered on an axis of rotation of the knob has a contrasting coloration and provides a visual and tactile indication of know location. A nub indicates rotational position of the knob.

6 Claims, 9 Drawing Sheets

(56) References Cited

U.S. PATENT DOCUMENTS

2011/0281652 A1* 11/2011 Laverdiere ............ G06F 3/0219
345/173
2015/0362121 A1* 12/2015 Tseng ...................... G06F 1/186
248/544

* cited by examiner

TOOL-LESS, LIMITED ROTATION, TELESCOPING FASTENER

TECHNICAL FIELD

The subject matter of this disclosure is generally related to fasteners, and more particularly to a fastening interface that facilitates installation and removal of closely spaced, field-replaceable electronics modules that are located in computer rooms and wiring closets.

BACKGROUND

Rack-mounted servers, storage systems, and other enterprise computer equipment will typically be located in computer rooms or wiring closets that are poorly illuminated and densely populated with equipment and cabling. Although some electronics modules are designed to be field-replaceable, it can be difficult for a technician to remove and install field-replaceable modules in a crowded computer back of a rack due to limited access and poor lighting. It is standard practice to use mechanical fasteners such as machine screws to secure a field-replaceable module to the chassis or rack in which the module is mounted. Mechanical connections help to secure the module in place and maintain secure connections between electrical connectors of the module and other equipment. However, mechanical fasteners typically require tools such as screwdrivers or ratchets for installation and removal, which is problematic because of the limited access, poor lighting, and other conditions found in the back of the rack systems. Alignment of machine screws with threaded holes or clips can also be difficult and tedious. Another problem is that considerable force may be required to remove and install a field-replaceable module due to friction between electrical connectors and between the module and the rack. It can be difficult for a technician to firmly grasp a replaceable module due to obstructions and limited handholds.

SUMMARY

All examples, aspects and features mentioned in this document can be combined in any technically possible way.

In accordance with some implementations a field-replaceable unit comprises: two fasteners for reversibly securing the field-replaceable unit to another module, each fastener comprising a telescoping knob that rotates 180 degrees in a first direction to engage a latch mechanism and rotates 180 degrees in a opposite direction to disengage the latch mechanism. A variety of features provide visual and tactile indications of knob location, latch state, and rotational position. A detent helps to prevent inadvertent disengagement of the latch mechanism.

In accordance with some implementations an apparatus comprises: a telescoping knob linked to a shuttle via a slide latch guide and a cylinder with a cam, the knob and cylinder configured to rotate in a common axis and the cam being offset from that axis and engaging an opening in the shuttle such that rotational movement of the knob causes rotational movement of the cylinder which causes movement of the shuttle in response to movement of the cam, the movement of the shuttle being limited to linear movement by the slide latch guide.

Other aspects, features, and implementations may become apparent in view of the detailed description and figures.

DETAILED DESCRIPTION

Aspects of the inventive concepts will be described as being implemented in connection with a data storage system such as a storage array. Such an implementation should not be viewed as limiting. Those of ordinary skill in the art will recognize that there are a wide variety of implementations of the inventive concepts in view of the teachings of the present disclosure.

Figure 1:
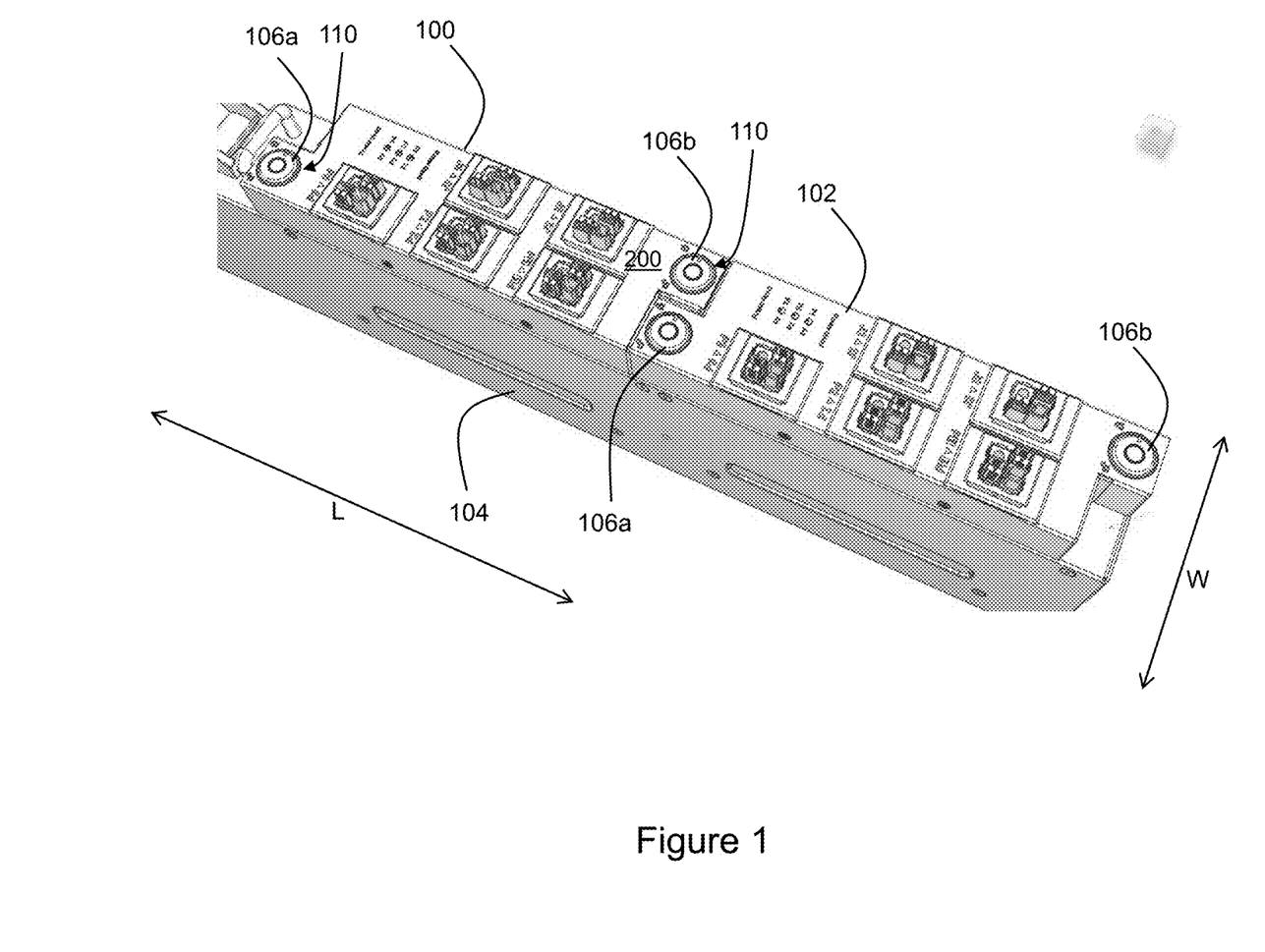
FIGS. 1 and 2 illustrate power distribution panels installed in a power distribution unit in the locked position.
Figure 2:
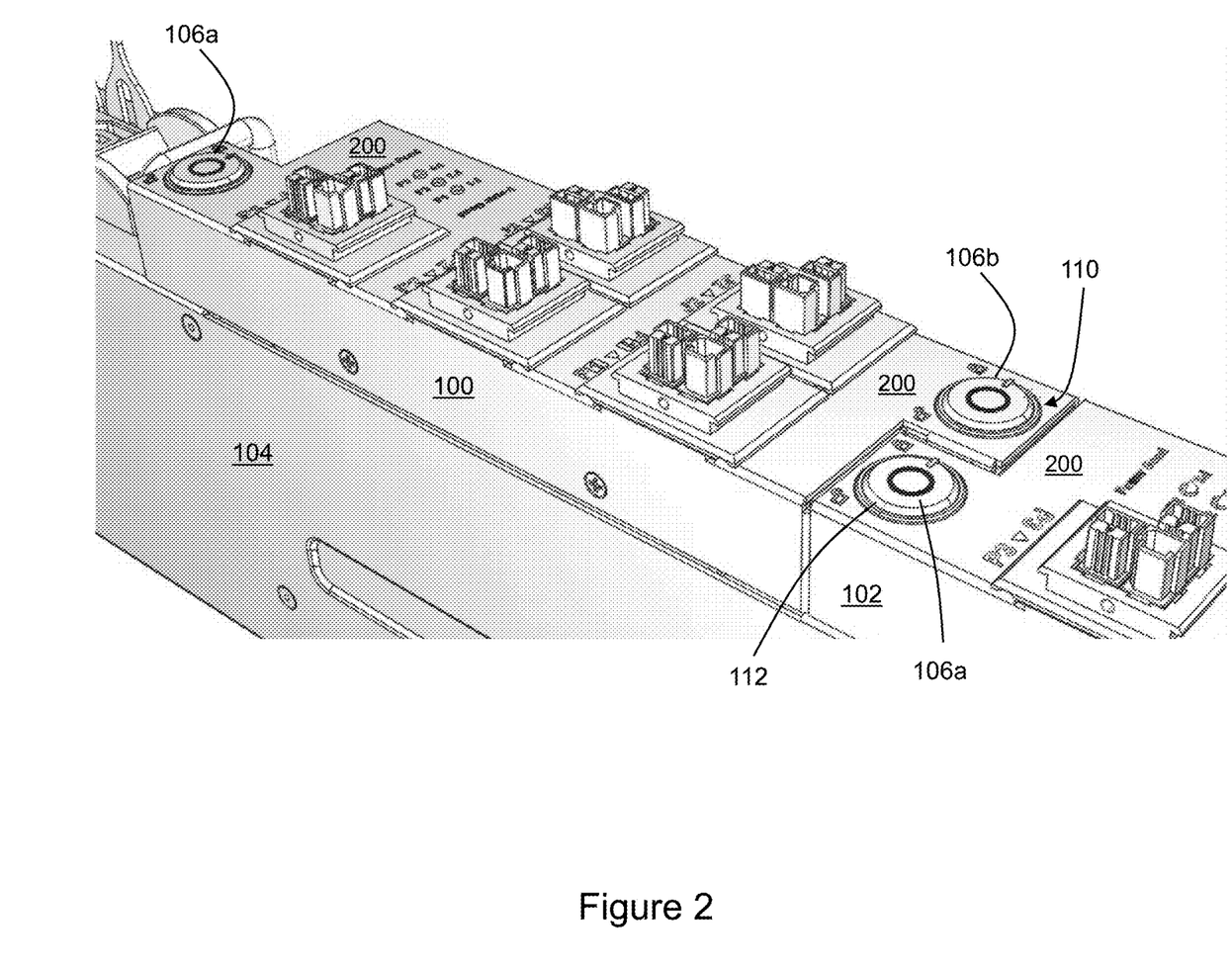

FIGS. 1 and 2 illustrate two power distribution panels (PDPs) 100, 102 installed in a locked position in a power distribution unit (PDU) 104 with the toolless mechanical fasteners disclosed herein. The PDPs and PDU may be used to provide power for a mass data storage system such as a storage array that is installed in a computer room or wiring closet. The PDPs are examples of field-replaceable units (FRUs). FRUs are intended to be practical for a technician to replace at the location at which the FRU is installed, e.g., the customer premises. PDPs 100, 102 may be hot-swapped into and out of the PDU 104 due to failures, to provide different voltage and current capabilities, or any of a variety of other reasons. The PDU 104 may be secured to a rack or chassis by standard fasteners such as machine screws. The toolless mechanical fasteners that are the subject of the present disclosure will be described in the context of securing PDPs to a PDU but that should not be viewed as limiting.

Each PDP 100, 102 is secured to the PDU 104 by a pair of the toolless mechanical fasteners, of which only telescoping knobs 106a, 106b are visible in FIGS. 1 and 2. The fasteners are located at opposite distal ends of each PDP along the length dimension L and are offset along a width dimension W. The adjacent fasteners of the lengthwise adjacent PDPs 100, 102 are positioned side-by-side along the width dimension. As such, each fastener has a small form factor that requires only one half of the width of the PDP. For example, circular openings 110 in the front face 200 of PDP 104 into which the knobs retract may have a diameter of 10-12 mm in some implementations. In contrast with alternative fastening mechanisms such as lever handles, the disclosed knobs 106a, 106b do not extend in the length or width dimensions beyond the edges of the PDP, which helps to avoid interference with equipment that is mounted adjacent in the rack.

In the locked and retracted position as shown, the exposed distal ends of the knobs 106a, 106b are nearly flush with the front faces of the PDP. More specifically, a first set of retracted knobs 106a, 106b are nearly flush with the front face 200 of power distribution panel 100 and second set of retracted knobs 106a, 106b are nearly flush with the front face 200 of power distribution panel 102. The portion of each retracted knob that remains extended beyond the front face of the PDP has an annular beveled edge 112. Consequently, a locked fastener with retracted knob does not present an obstruction to fingers, cabling, adjacent fasteners, or equipment that may be mounted adjacent to the PDU.

Figure 3:
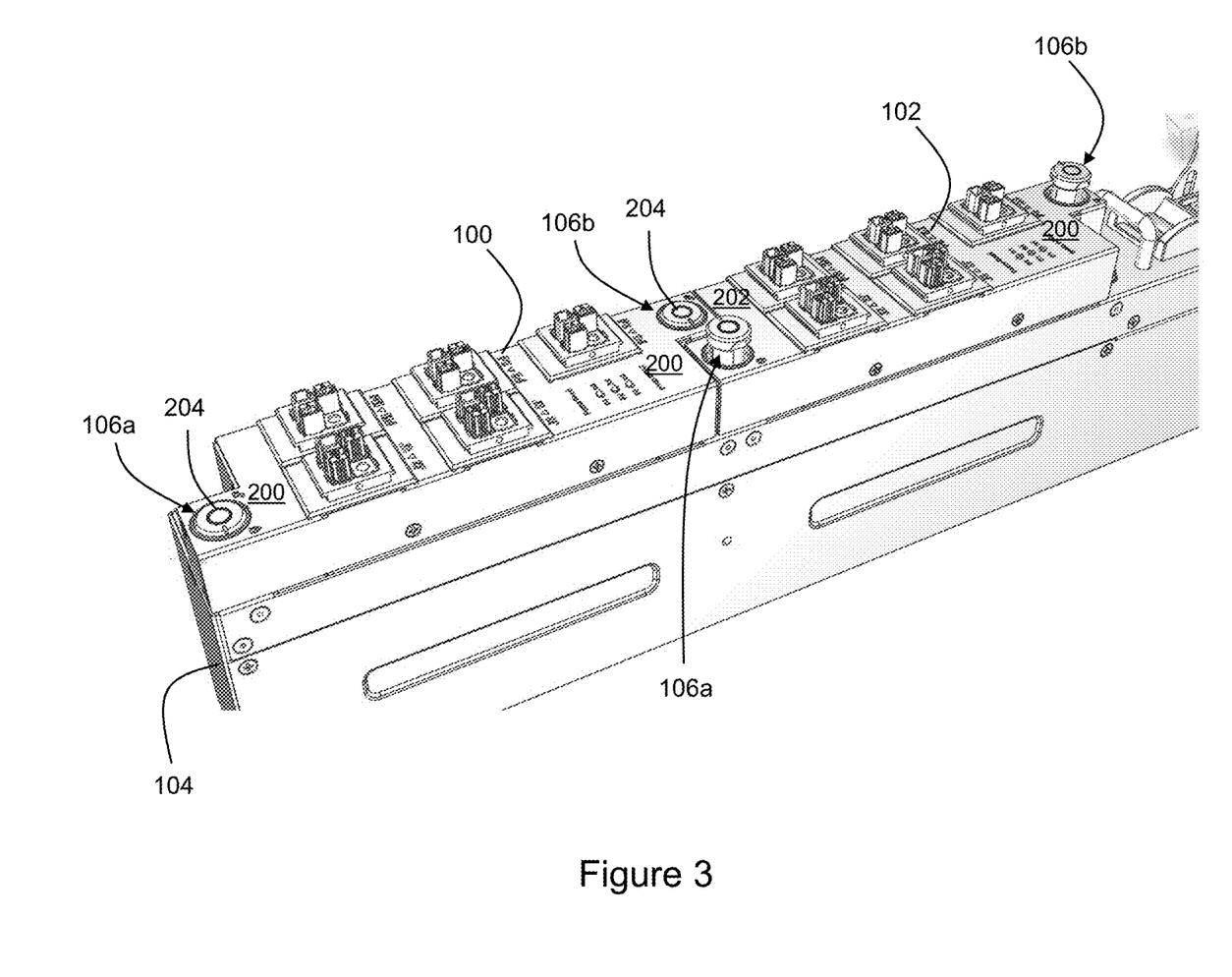
FIG. 3 illustrates extension of knobs for unlocking of one set of fasteners.

FIG. 3 illustrates extension of the pair of knobs 106a, 106b of PDP 102. Temporarily applying force against the externally visible portion of a retracted knob, such as by pressing and releasing the knob with a fingertip, causes the knob to automatically transition from the retracted state to an extended state. In other words, the knob pops out to allow for better finger engagement and access in space constrained areas. In the extended state the knob extends beyond the front face of the PDP. Knobs 106a, 106b of power distribution panel 102 are shown extended from front face 200. The range of extension may be, for example and without limitation, 18-21 mm between the retracted and extended positions. The push-to-release feature advantageously enables the fastener to be prepared for use by a simple tool-free press of a fingertip. Further, as will be explained in greater detail below, the knob will not stay retracted when in the unlocked state, so extension of the knob provides a visual and tactile indication of fastener engagement state.

Figure 4:
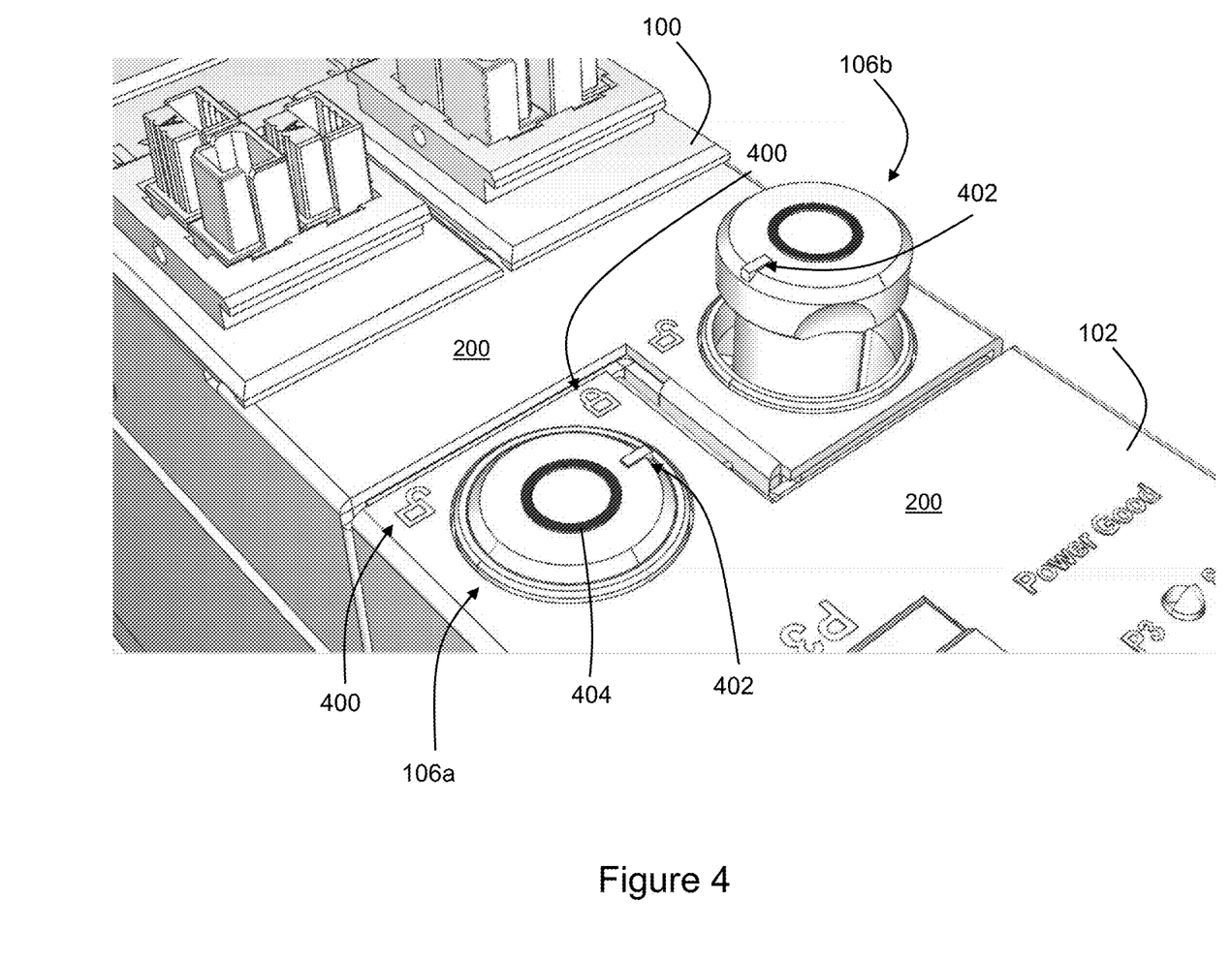
FIG. 4 illustrates an unlocked fastener adjacent to a locked fastener.

FIG. 4 illustrates an unlocked fastener adjacent to a locked fastener. The PDPs 100, 102 have visual indicators 400 of locked and unlocked positions formed on the front faces 200. In the illustrated example the visual indicators 400 are locked and unlocked padlock symbols. Each knob includes a nub 402 that provides a tactile and visual indication of the rotational position of the knob. The position of the nub 402 relative to the associated visual indicator 400 provides an indication of whether the knob has been rotated to the locked position or unlocked position. The fastener is engaged when the nub points in the direction of the "locked" visual indicator and the fastener is disengaged when the nub points in the direction of the "unlocked" visual indicator.

Counterclockwise (CCW) rotation of the extended knob by about 180 degrees transitions the fastener from the engaged state to the disengaged state. Clockwise (CW) rotation of the extended knob by about 180 degrees transitions the fastener from the disengaged state to the engaged state. Positive stops limit knob rotation to exactly 180 degrees, so the limits of knob rotation provide a tactile feedback of fastener engagement state. The relatively small rotational movement of the knob required to transition the fastener between the engaged state and disengaged state provides an ease-of-use advantage over standard fasteners that require multiple full revolutions.

A circular groove 404 is formed on the distal surface of the knob. The groove remains exposed when the knob is retracted. The circular groove is centered on the axis of rotation of the knob and helps to provide a tactile indication of knob location so that a technician can easily find the knob without necessarily seeing it. The nub 402 provides additional tactile feedback of knob location and rotational state. A contrasting color (relative to the knob) may be applied to the circular groove 404 to facilitate improved visual location of the knob. Non-limiting examples may include bright colors such as terracotta orange, and blue that contrast with a black or grey knob, such as terracotta orange to indicate powered operation and blue for non-powered operation requiring power down. A circular extension could be implemented as an alternative to a circular groove.

Figure 5:
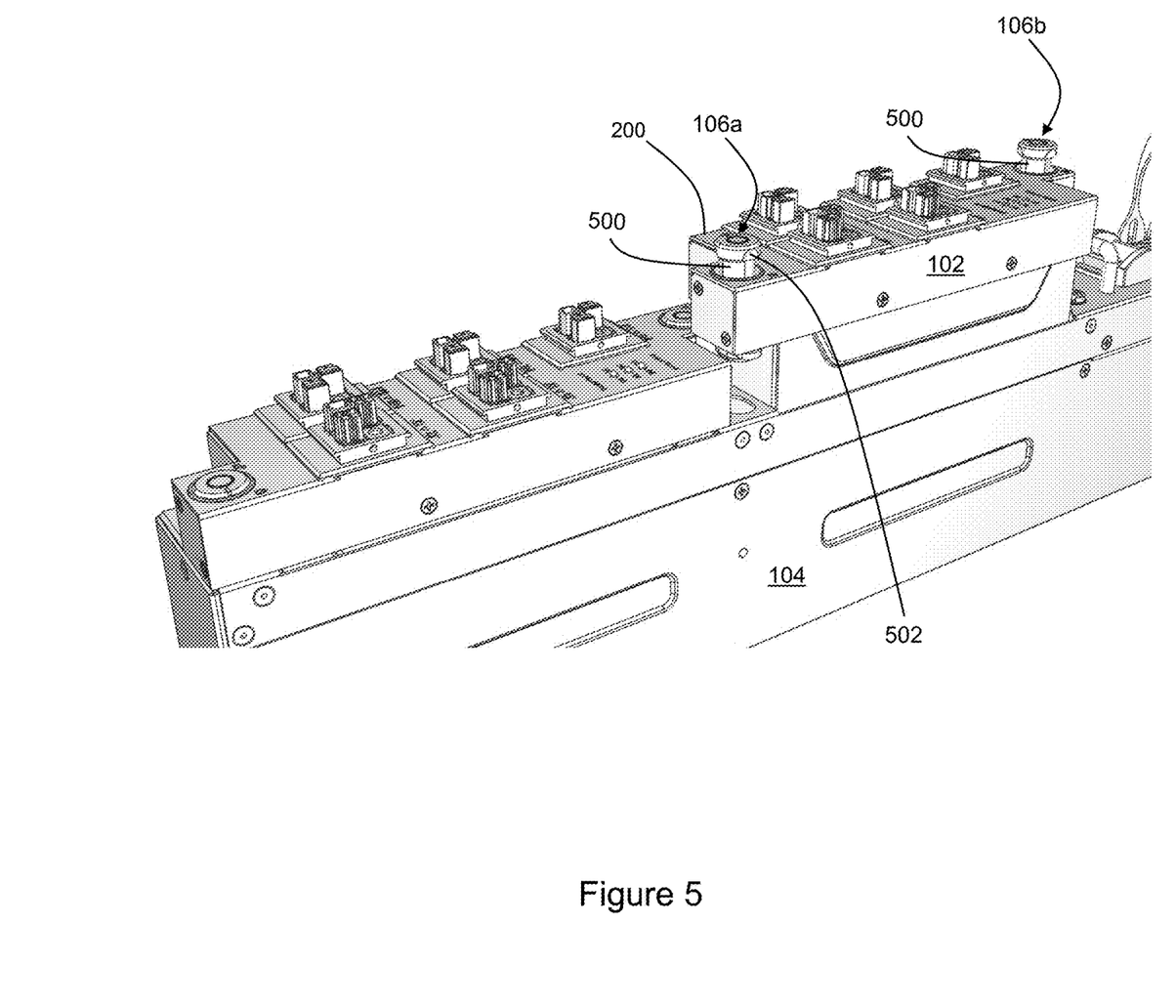
FIGS. 5 through 7 illustrate how a power distribution panel is removed from or installed into the power distribution unit.
Figure 6:
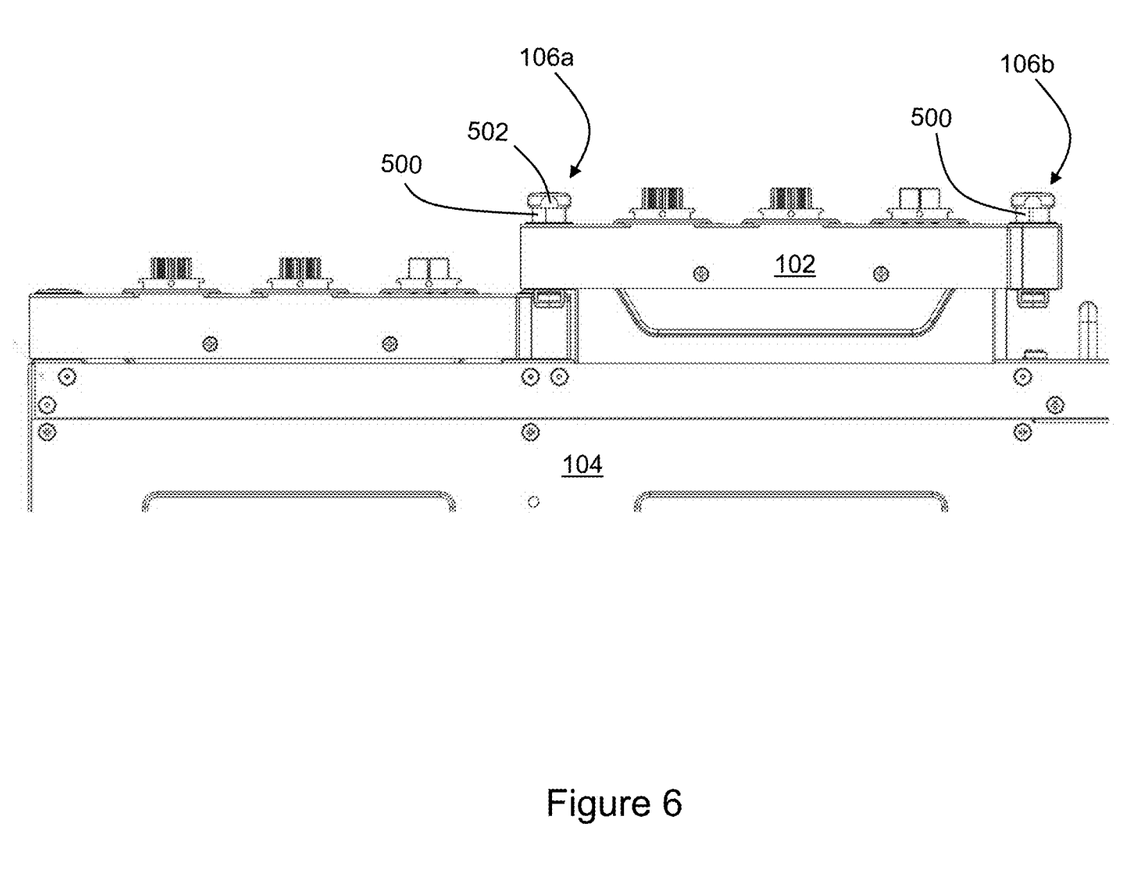
Figure 7:
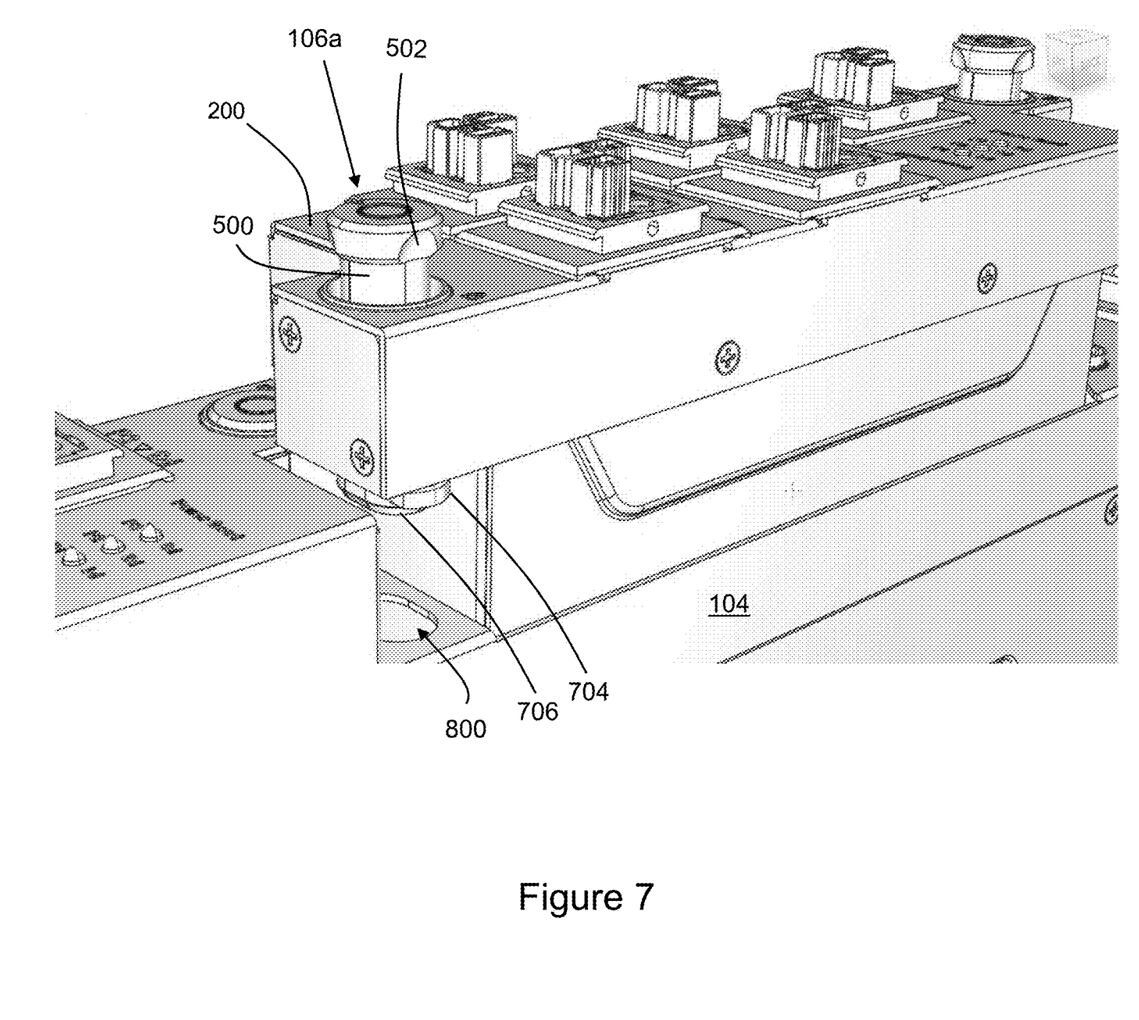

FIGS. 5 through 7 illustrate how a PDP is removed from, or installed into, the PDU. Each knob 106a, 106b has a larger diameter than a shaft 500 to which the knob is rotationally linked. Both the knob and shaft telescope beyond the front face 200 of the PDP when the knob is extended. The extension distance and difference in diameters between the knob and shaft may be selected to facilitate improved grasping of the knob with two fingers. Thus, two fingers may be used to rotate the knob between the locked position and the unlocked position. Further, two fingers (on each knob) may be used to apply the force required to pull the PDP away from the PDU when the fasteners are disengaged. The PDP may be seated in the PDU by pushing on the knobs or other parts of the front face of the PDP. Two semi-circular cutaways 502 formed along the outside edges of each knob provide increased clearance between the knob and the front face of the PDP to facilitate grasping of the knob with two fingers. Each cutaway 502 provides a finger-width area of reduced knob diameter into which one of the technician's fingers fits.

Figure 8:
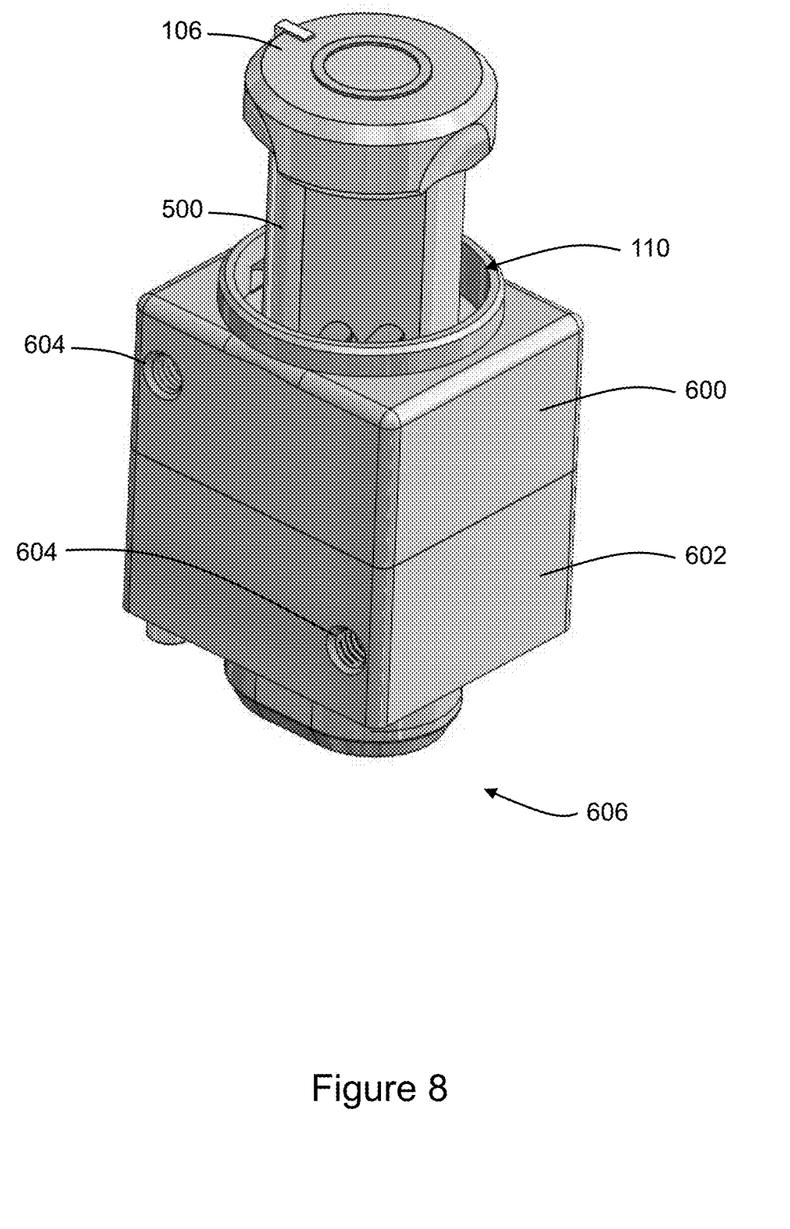
FIG. 8 illustrates a fastener subassembly.

FIG. 8 illustrates a fastener subassembly. The fastener subassembly includes a two-part housing consisting of an interconnected upper part 600 and lower part 602. The housing includes threaded openings 604 via which the subassembly can be secured to the PDP via machine screws. The knob 106 and shaft 500 extend from the circular opening 110, which is formed in the upper part 600 of the housing. A latch mechanism 606 extends from the lower part 602 of the housing.

Figure 9:
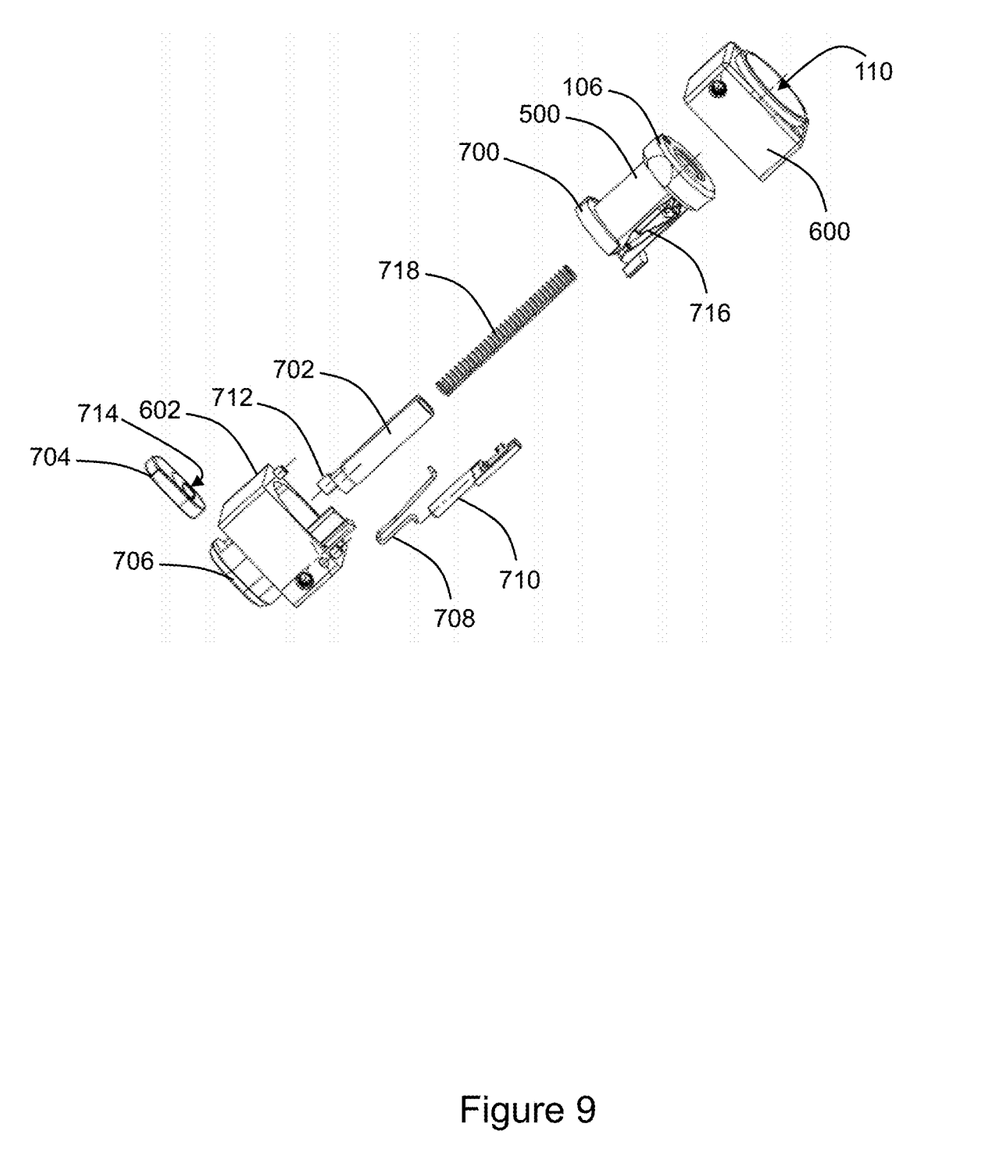
FIG. 9 is an exploded view of the fastener subassembly.

FIG. 9 is an exploded view of the fastener subassembly. A shoulder 700 at the distal end of the shaft 500 opposite the knob 106 has a diameter that is greater than the diameter of the circular opening 110 in the upper part 600 of the housing. Consequently, the shoulder 700 prevents the knob and shaft from being completely removed from the upper part 600 of the housing and thus helps to retain the fastening mechanism as captive. The shaft 500 is rotationally linked to a cylinder 702, both of which rotate in the same axis as the knob 106. The latch mechanism 606 (FIG. 8) that extends from the lower part 602 of the housing includes a slide latch guide 706 that limits motion of a latch shuttle 704 situated therein. More specifically, the slide latch guide 706 limits the shuttle 704 to linear movement that is orthogonal to the axis of rotation of the cylinder 702 and knob 106. The cylinder 702 includes a cam 712 that is offset from the axis of rotation. The cam 712 fits into an opening 714 in the shuttle 704. Rotation of the knob causes rotation of the cylinder which translates into linear motion of the shuttle due to the cam linkage. The direction of linear motion of the cam is determined by the direction of rotation of the knob, e.g., CW rotation retracts the shuttle and CCW rotation extends the shuttle, or vice versa. A trigger pin 710 and wire clip 708 prevent the knob from staying retracted when the knob is in the unlocked position and allow the knob to retract and extend when the knob is in the locked position (the push-to-release function). A spring 712 causes the knob 106 to automatically pop-out into the extended position when the knob is in the unlocked position or when the push-to-release function is used. The spring is disposed inside the cylinder 702 and seats at the enclosed bottom of the cylinder. The other distal end of the spring is seated in the shaft below the knob. A detent helps to maintain the knob in the locked position in the presence of vibration and other forces. The detent advantageously helps to inhibit inadvertent unlocking of the PDPs from the PDU during shipping.

Referring to FIGS. 7 and 9, the slide latch guide 706 is inserted into an opening 800 in the PDU 104 in preparation for securing the PDP to the PDU. The opening 800 is formed in a sheet metal front face of the PDU. The inner volume of the PDU proximate to the opening is free of obstructions to enable extension of the shuttle 704. The slide latch guide and opening in the PDU may have corresponding non-circular shapes to facilitate alignment. A beveled edge on the distal end of the slide latch guide may also help to facilitate alignment with the opening. With the shuttle in the retracted position the slide latch guide and shuttle can pass freely through the opening. After the slide latch guide 706 and shuttle 704 have been inserted through the opening 800, the knob is rotated CW 180 degrees, which causes the shuttle to linearly extend under the sheet metal of the PDU front face. Thus, the extended shuttle secures the PDP to the PDU via the sheet metal face. Tolerances between the extended shuttle, sheet metal and housing may be selected such that the PDP is secured to the PDU without excessive relative movement. The tolerances are also selected to ensure interconnection of electrical connectors via which the PDP is linked to the PDU when the PDP is secured to the PDU. For removal, the knob is rotated CCW 180 degrees, which causes the shuttle to linearly retract from under the sheet metal of the PDU front face. The slide latch guide and shuttle can then be pulled through the opening in the sheet metal as the PDP is removed from the PDU. The shuttle and cam, which secure to the sheet metal front face, advantageously obviate the need for clips, threaded openings, and other fastening features that would otherwise be associated with the PDU.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. A field-replaceable unit adapted for tool-less installation and removal via a front of a rack configured to hold a plurality of field-replaceable units, comprising:
a front face that extends away from the front of the rack with the field-replaceable unit installed in the rack in a locked position;
two fasteners disposed through the front face of the field-replaceable unit at opposite distal ends of the front face, the two fasteners adapted for reversibly securing the field-replaceable unit to the front of the rack, each fastener comprising a captive telescoping knob that rotates 180 degrees in a first direction to engage a latch mechanism with an opening in the front of the rack and rotates 180 degrees in a second direction to disengage the latch mechanism, the telescoping knobs coupled with the field-replaceable unit such that the field-replaceable unit is fully removable from the rack responsive to application of pulling force on the telescoping knobs with the telescoping knobs rotated such that the latch mechanisms are disengaged and the pulling force is directed away from the front of the rack, each knob comprising a spring situated in a cylinder with a cam configured to automatically extend the knob away from the front face in response to being pressed when the latch mechanism is engaged, the spring being configured to automatically extend the knob away from the front face when the latch mechanism is disengaged, each knob linked to a shuttle via a slide latch guide, the knob and cylinder configured to rotate in a common axis and the cam being offset from that axis and engaging an opening in the shuttle such that rotational movement of the knob causes rotational movement of the cylinder which causes movement of the shuttle in response to movement of the cam, the movement of the shuttle being limited to linear movement by the slide latch guide, the spring and engagement of the cam causing the knob to alternately extend and retract in response to being pressed successive times when the latch mechanism is engaged.

2. The field-replaceable unit of claim 1 wherein each knob is connected to a shaft characterized by a smaller diameter than the knob.

3. The field-replaceable unit of claim 2 wherein each knob comprises two cutaways formed in outside edges of the knob.

4. The field-replaceable unit of claim 3 wherein each knob comprises a circular groove centered on an axis of rotation of the knob.

5. The field-replaceable unit of claim 4 wherein each knob and its circular groove have contrasting coloration.

6. The field-replaceable unit of claim 5 wherein each knob comprises a nub that indicates rotational position.

* * * * *